United States Patent
Wang et al.

(10) Patent No.: US 10,777,259 B1
(45) Date of Patent: Sep. 15, 2020

(54) STATIC RANDOM-ACCESS MEMORY (SRAM) FOR IN-MEMORY COMPUTING

(71) Applicant: QUALCOMM Incorporated, San Diego, CA (US)

(72) Inventors: Zhongze Wang, San Diego, CA (US); Xiaochun Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/415,204

(22) Filed: May 17, 2019

(51) Int. Cl.
  *G11C 11/00* (2006.01)
  *G11C 11/412* (2006.01)
  *G06N 3/02* (2006.01)
  *H03K 19/21* (2006.01)
  *G11C 11/418* (2006.01)

(52) U.S. Cl.
  CPC .............. *G11C 11/412* (2013.01); *G06N 3/02* (2013.01); *G11C 11/418* (2013.01); *H03K 19/215* (2013.01)

(58) Field of Classification Search
  CPC ....... G11C 11/412; G11C 11/418; G06N 3/02; H03K 19/215
  USPC .................................................. 365/156, 154
  See application file for complete search history.

(56) References Cited

U.S. PATENT DOCUMENTS

| | | | |
|---|---|---|---|
| 2007/0177419 A1* | 8/2007 | Sachdev | G11C 11/412 365/156 |
| 2014/0254290 A1* | 9/2014 | Chan | G11C 7/00 365/189.15 |
| 2020/0012924 A1* | 1/2020 | Ma | G06N 3/063 |

OTHER PUBLICATIONS

Agrawal A., et al., "Xcel-RAM: Accelerating Binary Neural Networks in High-Throughput SRAM Compute Arrays", Jul. 1, 2018, IEEE School of Electrical and Computer Engineering, 7 pages.
Jiang Z., et al., "XNOR-SRAM: In-Memory Computing SRAM Macro for Binary/Ternary Deep Neural Networks", 2018 IEEE Symposium on VLSI Technology Digest of Technical Papers, IEEE , 2018, pp. 173-174.

* cited by examiner

*Primary Examiner* — Huan Hoang
(74) *Attorney, Agent, or Firm* — Patterson & Sheridan, L.L.P.

(57) ABSTRACT

Certain aspects of the present disclosure are directed to methods and apparatus for convolution computation. One example apparatus generally includes a static random-access memory (SRAM) having a plurality of memory cells. Each of the plurality of memory cells may include a flip-flop (FF) having an output node and a complementary output node; a first switch coupled between the output node and a bit line (BL) of the SRAM, the first switch having a control input coupled to a word line (WL) of the SRAM; and a second switch coupled between the complementary output node and a complementary bit line (BLB) of the SRAM, the second switch having another control input coupled to a complementary word line (WLB) of the SRAM.

17 Claims, 13 Drawing Sheets

1100

| Xi | WL | WLB | Wij | N1 | N2 | BL | BLB | Yj |
|----|----|-----|-----|----|----|----|-----|----|
| 1  | 1  | 0   | 1   | 0  | 1  | 1  | 0   | 1  |
| 1  | 1  | 0   | 0   | 1  | 0  | 0  | 0   | 0  |
| 0  | 0  | 1   | 1   | 0  | 1  | 0  | 0   | 0  |
| 0  | 0  | 1   | 0   | 1  | 0  | 0  | 1   | 1  |

Input | weight | output

| Xi | WL | WLB | Wij | N1 | N2 | BL | BLB | Yj |
|---|---|---|---|---|---|---|---|---|
| 1 | 1 | 1 | 0 | 1 | 1 | 0 | 0 | 0 |
| 1 | 1 | 1 | 1 | 0 | 0 | 1 | 1 | 1 |
| 0 | 0 | 0 | 0 | 1 | 1 | 0 | 0 | 0 |
| 0 | 0 | 0 | 1 | 0 | 0 | 0 | 0 | 0 |

Input        weight        output

| Xi | WL | WLB | Wij | N1 | N2 | BL | BLB | Yj |
|----|----|-----|-----|----|----|----|-----|----|
| 0 | 1 | 1 | 1 | 1 | 1 | 0 | 0 | 0 |
| 0 | 1 | 1 | 0 | 0 | 0 | 1 | 1 | 1 |
| 1 | 0 | 0 | 1 | 1 | 1 | 0 | 0 | 0 |
| 1 | 0 | 0 | 0 | 0 | 0 | 0 | 0 | 0 |

Input      weight      output

STATIC RANDOM-ACCESS MEMORY (SRAM) FOR IN-MEMORY COMPUTING

FIELD OF THE DISCLOSURE

The present disclosure generally relates to artificial neural networks and, more particularly, to techniques and apparatus for performing in-memory convolution computations.

DESCRIPTION OF RELATED ART

An artificial neural network, which may be composed of an interconnected group of artificial neurons (e.g., neuron models), is a computational device or represents a method performed by a computational device. These neural networks may be used for various applications and/or devices, such as Internet Protocol (IP) cameras, Internet of Things (IoT) devices, autonomous vehicles, and/or service robots.

Convolutional neural networks (CNNs) are a type of feed-forward artificial neural network. Convolutional neural networks may include collections of artificial neurons that each have a receptive field and that collectively tile an input space. Convolutional neural networks have numerous applications. In particular, CNNs have broadly been used in the area of pattern recognition and classification.

In layered neural network architectures, the output of a first layer of artificial neurons becomes an input to a second layer of artificial neurons, the output of a second layer of artificial neurons becomes an input to a third layer of artificial neurons, and so on. Convolutional neural networks may be trained to recognize a hierarchy of features. Computation in convolutional neural network architectures may be distributed over a population of processing nodes, which may be configured in one or more computational chains. These multi-layered architectures may be trained one layer at a time and may be fine-tuned using back propagation.

SUMMARY

Certain aspects of the present disclosure are directed to methods and apparatus for in-memory convolution computation.

Certain aspects provide an apparatus for convolution computation. The apparatus generally includes a static random-access memory (SRAM) having a plurality of memory cells. Each of the plurality of memory cells may include a flip-flop (FF) having an output node and a complementary output node; a first switch coupled between the output node and a bit line (BL) of the SRAM, the first switch having a control input coupled to a word line (WL) of the SRAM; and a second switch coupled between the complementary output node and a complementary bit line (BLB) of the SRAM, the second switch having another control input coupled to a complementary word line (WLB) of the SRAM.

Certain aspects provide a method for convolution computation. The method generally includes driving a WL and a WLB of a static random-access memory (SRAM) based on an input signal, detecting current flow in at least one of a BL or a BLB of the SRAM while driving the WL and the WLB, and generating at least one output signal based on the detection of the current flow.

Certain aspects provide an apparatus for convolution computation. The apparatus generally includes means for driving a WL and a WLB of an SRAM based on an input signal, and means for detecting current flow in at least one of a BL or a BLB of the SRAM while driving the WL and the WLB, the means for detecting comprising means for generating at least one output signal based on the detection of the current flow.

Other aspects, advantages, and features of the present disclosure will become apparent after review of the entire application, including the following sections: Brief Description of the Drawings, Detailed Description, and the Claims.

BRIEF DESCRIPTION OF THE DRAWINGS

FIG. 11A illustrates a truth table corresponding to an XNOR operation, in accordance with certain aspects of the present disclosure.

FIG. 11B illustrates a truth table corresponding to a dot product (AND) operation, in accordance with certain aspects of the present disclosure.

FIG. 11C illustrates a truth table corresponding to a NOR operation, in accordance with certain aspects of the present disclosure.

DETAILED DESCRIPTION

Certain aspects of the present disclosure provide methods and apparatus for in-memory convolution computations for artificial neural networks.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Example Artificial Neural Networks

Figure 1:
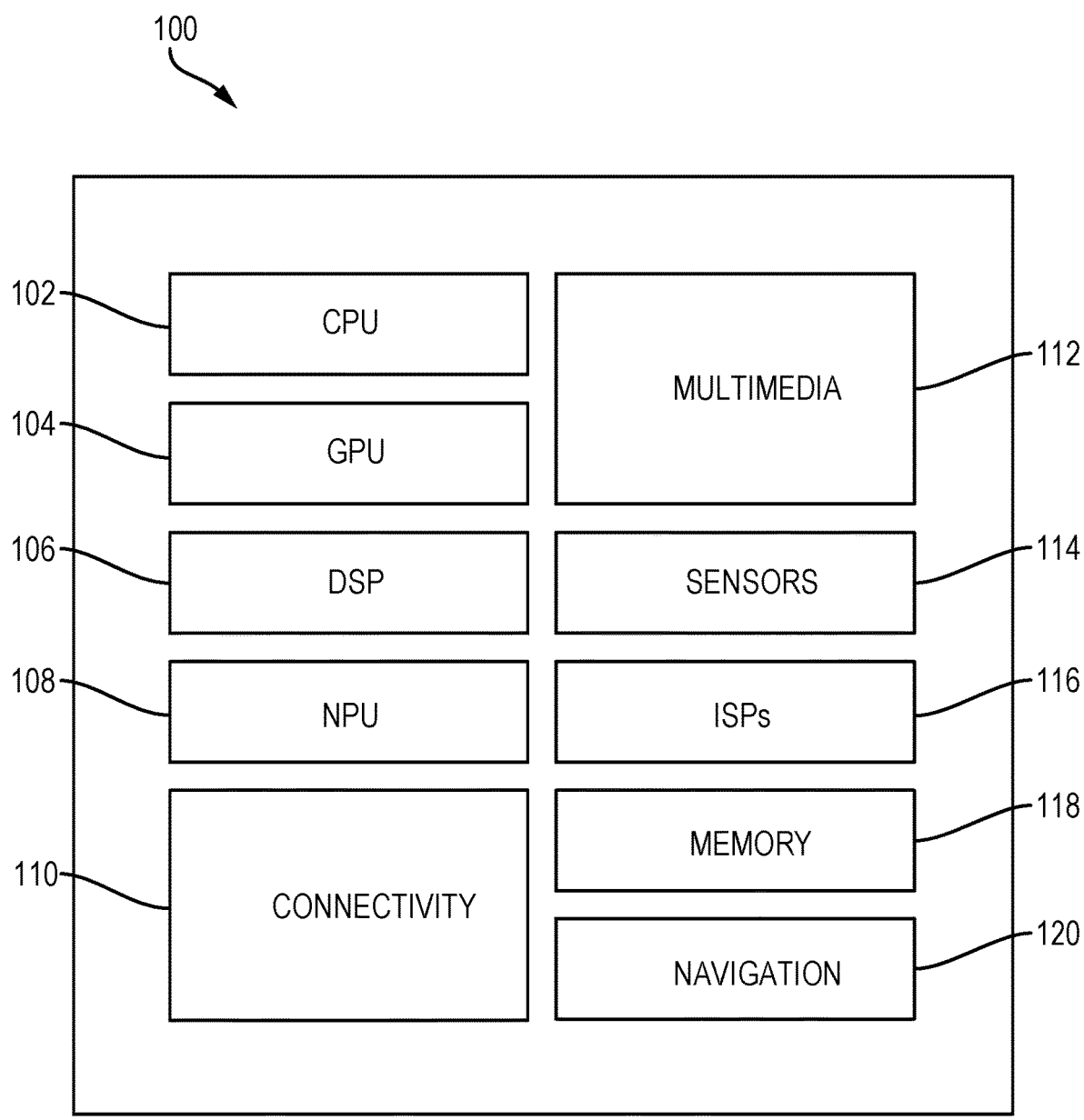
FIG. 1 illustrates an example implementation of a system-on-a-chip (SOC).

FIG. 1 illustrates an example implementation of a system-on-a-chip (SOC) 100, which may include a central processing unit (CPU) 102 or a multi-core CPU configured to perform a parallel Monte Carlo dropout function, in accordance with certain aspects of the present disclosure. Variables (e.g., neural signals and synaptic weights), system parameters associated with a computational device (e.g., neural network with weights), delays, frequency bin information, and task information may be stored in a memory block associated with a neural processing unit (NPU) 108, in a memory block associated with a CPU 102, in a memory block associated with a graphics processing unit (GPU) 104, in a memory block associated with a digital signal processor (DSP) 106, in a memory block 118, or may be distributed across multiple blocks. In certain aspects, weights may be stored in a static random-access memory (SRAM) configured to in-memory computations, as described in more detail herein. Instructions executed at the CPU 102 may be loaded from a program memory associated with the CPU 102 or may be loaded from a memory block 118.

The SOC 100 may also include additional processing blocks tailored to specific functions, such as a GPU 104, a DSP 106, a connectivity block 110, which may include fifth generation (5G) connectivity, fourth generation long term evolution (4G LTE) connectivity, Wi-Fi connectivity, USB connectivity, Bluetooth connectivity, and the like, and a multimedia processor 112 that may, for example, detect and recognize gestures. In one implementation, the NPU is implemented in the CPU, DSP, and/or GPU. The SOC 100 may also include a sensor processor 114, image signal processors (ISPs) 116, and/or navigation module 120, which may include a global positioning system.

The SOC 100 may be based on an ARM instruction set. In an aspect of the present disclosure, the instructions loaded into the CPU 102 may comprise code to search for a stored multiplication result in a lookup table (LUT) corresponding to a multiplication product of an input feature value and a filter weight. The instructions loaded into the CPU 102 may also comprise code to disable a multiplier during a multiplication operation of the multiplication product when a lookup table hit of the multiplication product is detected. In addition, the instructions loaded into the CPU 102 may comprise code to store a computed multiplication product of the input feature and the filter weight when a lookup table miss of the multiplication product is detected.

SOC 100 and/or components thereof may be configured to perform video compression and/or decompression according to aspects of the present disclosure discussed below. By using deep learning architectures to perform video compression and/or decompression, aspects of the present disclosure may accelerate the compression of video content on a device and transmission of the compressed video to another device and/or may accelerate the decompression of compressed video content received at the device.

Deep learning architectures may perform an object recognition task by learning to represent inputs at successively higher levels of abstraction in each layer, thereby building up a useful feature representation of the input data. In this way, deep learning addresses a major bottleneck of traditional machine learning. Prior to the advent of deep learning, a machine learning approach to an object recognition problem may have relied heavily on human engineered features, perhaps in combination with a shallow classifier. A shallow classifier may be a two-class linear classifier, for example, in which a weighted sum of the feature vector components may be compared with a threshold to predict to which class the input belongs. Human engineered features may be templates or kernels tailored to a specific problem domain by engineers with domain expertise. Deep learning architectures, in contrast, may learn to represent features that are similar to what a human engineer might design, but through training. Furthermore, a deep network may learn to represent and recognize new types of features that a human might not have considered.

A deep learning architecture may learn a hierarchy of features. If presented with visual data, for example, the first layer may learn to recognize relatively simple features, such as edges, in the input stream. In another example, if presented with auditory data, the first layer may learn to recognize spectral power in specific frequencies. The second layer, taking the output of the first layer as input, may learn to recognize combinations of features, such as simple shapes for visual data or combinations of sounds for auditory data. For instance, higher layers may learn to represent complex shapes in visual data or words in auditory data. Still higher layers may learn to recognize common visual objects or spoken phrases.

Deep learning architectures may perform especially well when applied to problems that have a natural hierarchical structure. For example, the classification of motorized vehicles may benefit from first learning to recognize wheels, windshields, and other features. These features may be combined at higher layers in different ways to recognize cars, trucks, and airplanes.

Neural networks may be designed with a variety of connectivity patterns. In feed-forward networks, information is passed from lower to higher layers, with each neuron in a given layer communicating to neurons in higher layers. A hierarchical representation may be built up in successive layers of a feed-forward network, as described above. Neural networks may also have recurrent or feedback (also called top-down) connections. In a recurrent connection, the output from a neuron in a given layer may be communicated to another neuron in the same layer. A recurrent architecture may be helpful in recognizing patterns that span more than one of the input data chunks that are delivered to the neural network in a sequence. A connection from a neuron in a given layer to a neuron in a lower layer is called a feedback (or top-down) connection. A network with many feedback connections may be helpful when the recognition of a high-level concept may aid in discriminating the particular low-level features of an input.

Figure 2A:
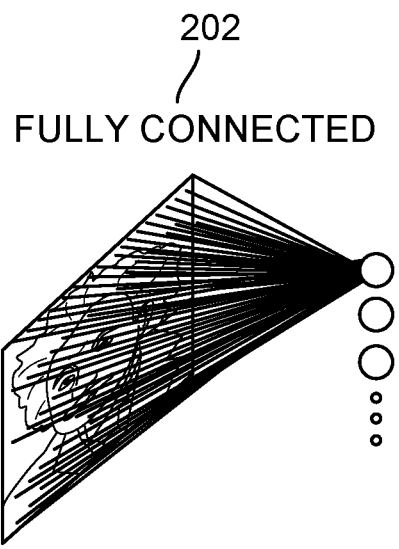
FIG. 2A illustrates an example of a fully connected neural network.
Figure 2B:
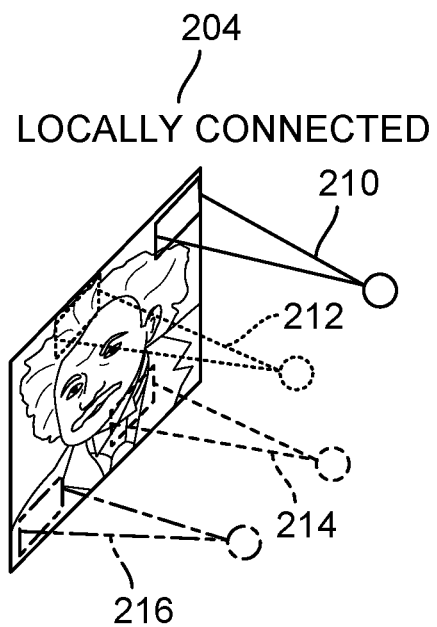
FIG. 2B illustrates an example of a locally connected neural network.

The connections between layers of a neural network may be fully connected or locally connected. FIG. 2A illustrates an example of a fully connected neural network 202. In a fully connected neural network 202, a neuron in a first layer may communicate its output to every neuron in a second layer, so that each neuron in the second layer will receive input from every neuron in the first layer. FIG. 2B illustrates an example of a locally connected neural network 204. In a locally connected neural network 204, a neuron in a first layer may be connected to a limited number of neurons in the second layer. More generally, a locally connected layer of the locally connected neural network 204 may be configured so that each neuron in a layer will have the same or a similar connectivity pattern, but with connections strengths that may have different values (e.g., 210, 212, 214, and 216). The locally connected connectivity pattern may give rise to spatially distinct receptive fields in a higher layer, because the higher layer neurons in a given region may receive inputs that are tuned through training to the properties of a restricted portion of the total input to the network.

Figure 2C:
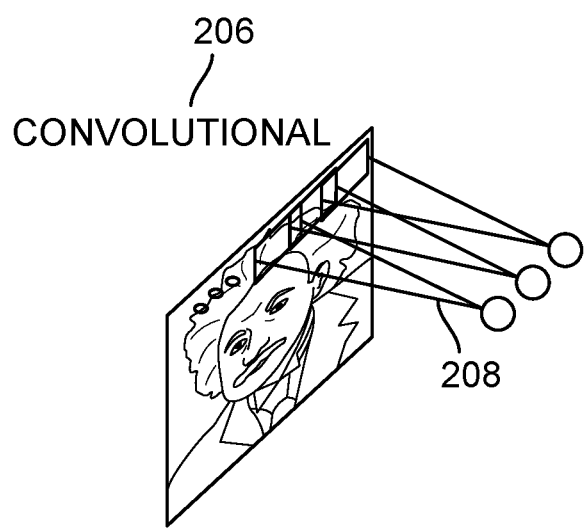
FIG. 2C illustrates an example of a convolutional neural network.

One example of a locally connected neural network is a convolutional neural network. FIG. 2C illustrates an example of a convolutional neural network 206. The convolutional neural network 206 may be configured such that the connection strengths associated with the inputs for each neuron in the second layer are shared (e.g., 208). Convolutional neural networks may be well suited to problems in which the spatial location of inputs is meaningful. Convolutional neural network 206 may be used to perform one or more aspects of video compression and/or decompression, according to aspects of the present disclosure.

Figure 2D:
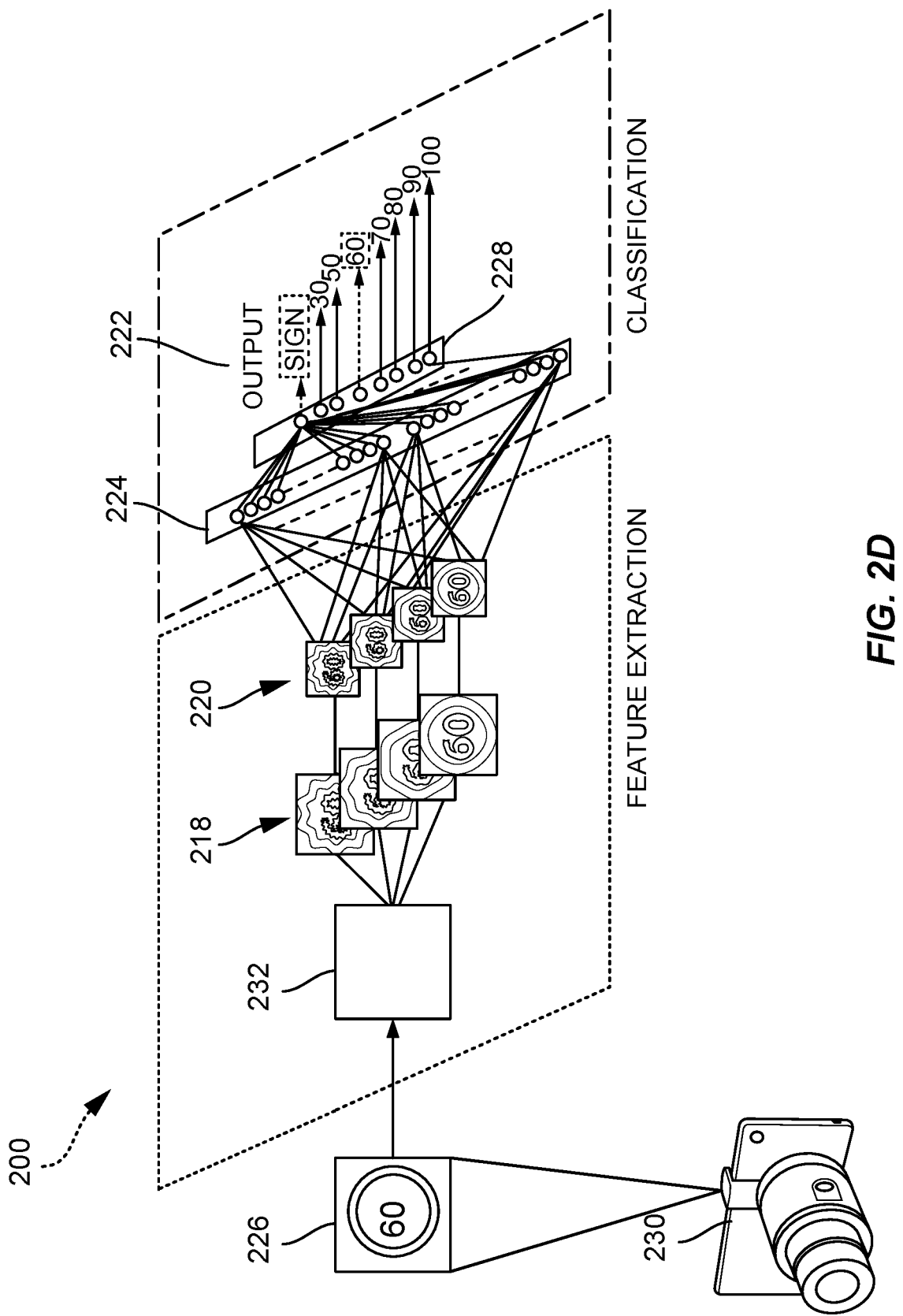
FIG. 2D illustrates a detailed example of a deep convolutional network (DCN) designed to recognize visual features from an image.

One type of convolutional neural network is a deep convolutional network (DCN). FIG. 2D illustrates a detailed example of a DCN 200 designed to recognize visual features from an image 226 input from an image capturing device 230, such as a car-mounted camera. The DCN 200 of the current example may be trained to identify traffic signs and a number provided on the traffic sign. Of course, the DCN 200 may be trained for other tasks, such as identifying lane markings or identifying traffic lights.

The DCN 200 may be trained with supervised learning. During training, the DCN 200 may be presented with an image, such as the image 226 of a speed limit sign, and a forward pass may then be computed to produce an output 222. The DCN 200 may include a feature extraction section and a classification section. Upon receiving the image 226, a convolutional layer 232 may apply convolutional kernels (not shown) to the image 226 to generate a first set of feature maps 218. As an example, the convolutional kernel for the convolutional layer 232 may be a 5×5 kernel that generates 28×28 feature maps. In the present example, because four different feature maps are generated in the first set of feature maps 218, four different convolutional kernels were applied to the image 226 at the convolutional layer 232. The convolutional kernels may also be referred to as filters or convolutional filters.

The first set of feature maps 218 may be subsampled by a max pooling layer (not shown) to generate a second set of feature maps 220. The max pooling layer reduces the size of the first set of feature maps 218. That is, a size of the second set of feature maps 220, such as 14×14, is less than the size of the first set of feature maps 218, such as 28×28. The reduced size provides similar information to a subsequent layer while reducing memory consumption. The second set of feature maps 220 may be further convolved via one or more subsequent convolutional layers (not shown) to generate one or more subsequent sets of feature maps (not shown).

In the example of FIG. 2D, the second set of feature maps 220 is convolved to generate a first feature vector 224. Furthermore, the first feature vector 224 is further convolved to generate a second feature vector 228. Each feature of the second feature vector 228 may include a number that corresponds to a possible feature of the image 226, such as "sign," "60," and "100." A softmax function (not shown) may convert the numbers in the second feature vector 228 to a probability. As such, an output 222 of the DCN 200 is a probability of the image 226 including one or more features.

In the present example, the probabilities in the output 222 for "sign" and "60" are higher than the probabilities of the others of the output 222, such as "30," "40," "50," "70," "80," "90," and "100". Before training, the output 222 produced by the DCN 200 is likely to be incorrect. Thus, an error may be calculated between the output 222 and a target output. The target output is the ground truth of the image 226 (e.g., "sign" and "60"). The weights of the DCN 200 may then be adjusted so the output 222 of the DCN 200 is more closely aligned with the target output. In certain aspects, the weights of the DCN 200 may be stored in an SRAM configured for in-memory computations, as described in more detail herein.

To adjust the weights, a learning algorithm may compute a gradient vector for the weights. The gradient may indicate an amount that an error would increase or decrease if the weight were adjusted. At the top layer, the gradient may correspond directly to the value of a weight connecting an activated neuron in the penultimate layer and a neuron in the output layer. In lower layers, the gradient may depend on the value of the weights and on the computed error gradients of the higher layers. The weights may then be adjusted to reduce the error. This manner of adjusting the weights may be referred to as "back propagation" as it involves a "backward pass" through the neural network.

In practice, the error gradient of weights may be calculated over a small number of examples, so that the calculated gradient approximates the true error gradient. This approximation method may be referred to as stochastic gradient descent. Stochastic gradient descent may be repeated until the achievable error rate of the entire system has stopped decreasing or until the error rate has reached a target level. After learning, the DCN may be presented with new images (e.g., the speed limit sign of the image 226) and a forward pass through the network may yield an output 222 that may be considered an inference or a prediction of the DCN.

Deep belief networks (DBNs) are probabilistic models comprising multiple layers of hidden nodes. DBNs may be used to extract a hierarchical representation of training data sets. A DBN may be obtained by stacking up layers of Restricted Boltzmann Machines (RBMs). An RBM is a type of artificial neural network that can learn a probability distribution over a set of inputs. Because RBMs can learn a probability distribution in the absence of information about the class to which each input should be categorized, RBMs are often used in unsupervised learning. Using a hybrid unsupervised and supervised paradigm, the bottom RBMs of a DBN may be trained in an unsupervised manner and may serve as feature extractors, and the top RBM may be trained in a supervised manner (on a joint distribution of inputs from the previous layer and target classes) and may serve as a classifier.

Deep convolutional networks (DCNs) are networks of convolutional networks, configured with additional pooling and normalization layers. DCNs have achieved state-of-the-art performance on many tasks. DCNs can be trained using supervised learning in which both the input and output targets are known for many exemplars and are used to modify the weights of the network by use of gradient descent methods.

DCNs may be feed-forward networks. In addition, as described above, the connections from a neuron in a first layer of a DCN to a group of neurons in the next higher layer are shared across the neurons in the first layer. The feed-forward and shared connections of DCNs may be exploited for fast processing. The computational burden of a DCN may be much less, for example, than that of a similarly sized neural network that comprises recurrent or feedback connections.

The processing of each layer of a convolutional network may be considered a spatially invariant template or basis projection. If the input is first decomposed into multiple channels, such as the red, green, and blue channels of a color image, then the convolutional network trained on that input may be considered three-dimensional, with two spatial dimensions along the axes of the image and a third dimension capturing color information. The outputs of the convolutional connections may be considered to form a feature map in the subsequent layer, with each element of the feature map (e.g., 220) receiving input from a range of neurons in the previous layer (e.g., feature maps 218) and from each of the multiple channels. The values in the feature map may be further processed with a non-linearity, such as a rectification, max(0,x). Values from adjacent neurons may be further pooled, which corresponds to down sampling, and may provide additional local invariance and dimensionality reduction. Normalization, which corresponds to whitening, may also be applied through lateral inhibition between neurons in the feature map.

The performance of deep learning architectures may increase as more labeled data points become available or as computational power increases. Modern deep neural networks are routinely trained with computing resources that are thousands of times greater than what was available to a typical researcher just fifteen years ago. New architectures and training paradigms may further boost the performance of deep learning. Rectified linear units may reduce a training issue known as vanishing gradients. New training techniques may reduce over-fitting and thus enable larger models to achieve better generalization. Encapsulation techniques may abstract data in a given receptive field and further boost overall performance.

Figure 3:
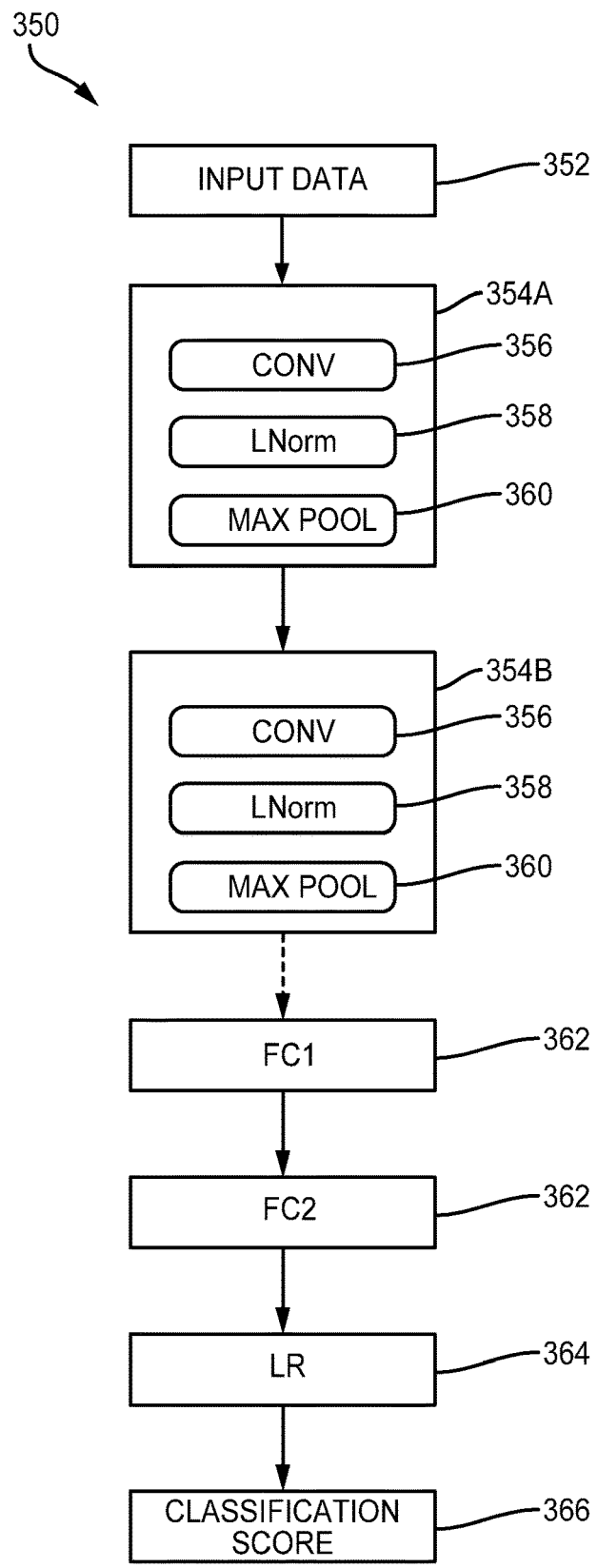
FIG. 3 is a block diagram illustrating a deep convolutional network (DCN).

FIG. 3 is a block diagram illustrating a deep convolutional network 350. The deep convolutional network 350 may include multiple different types of layers based on connectivity and weight sharing. As shown in FIG. 3E, the deep convolutional network 350 includes the convolution blocks 354A, 354B. Each of the convolution blocks 354A, 354B may be configured with a convolution layer (CONV) 356, a normalization layer (LNorm) 358, and a max pooling layer (MAX POOL) 360. Deep convolutional network 350 may be used to perform video compression and/or decompression, according to aspects of the present disclosure.

The convolution layers 356 may include one or more convolutional filters, which may be applied to the input data to generate a feature map. Although only two of the convolution blocks 354A, 354B are shown, the present disclosure is not so limiting, and instead, any number of the convolution blocks 354A, 354B may be included in the deep convolutional network 350 according to design preference. The normalization layer 358 may normalize the output of the convolution filters. For example, the normalization layer 358 may provide whitening or lateral inhibition. The max pooling layer 360 may provide down sampling aggregation over space for local invariance and dimensionality reduction.

The parallel filter banks, for example, of a deep convolutional network may be loaded on a CPU 102 or GPU 104 of an SOC 100 to achieve high performance and low power consumption. In alternative aspects, the parallel filter banks may be loaded on the DSP 106 or an ISP 116 of an SOC 100. In addition, the deep convolutional network 350 may access other processing blocks that may be present on the SOC 100, such as sensor processor 114 and navigation module 120, dedicated, respectively, to sensors and navigation.

The deep convolutional network 350 may also include one or more fully connected layers 362 (FC1 and FC2). The deep convolutional network 350 may further include a logistic regression (LR) layer 364. Between each layer 356, 358, 360, 362, 364 of the deep convolutional network 350 are weights (not shown) that are to be updated. In certain aspects, the weights may be stored in an SRAM configured for in-memory computations, as described in more detail herein. The output of each of the layers (e.g., 356, 358, 360, 362, 364) may serve as an input of a succeeding one of the layers (e.g., 356, 358, 360, 362, 364) in the deep convolutional network 350 to learn hierarchical feature representations from input data 352 (e.g., images, audio, video, sensor data and/or other input data) supplied at the first of the convolution blocks 354A. The output of the deep convolutional network 350 is a classification score 366 for the input data 352. The classification score 366 may be a set of probabilities, where each probability is the probability of the input data including a feature from a set of features.

Example Static Random-Access Memory (SRAM) for in-Memory Computing

In binary weight networks, weights and neuron activations are binarized and represented by +1 or −1 values. A convolutional neural network (CNN) with binary weights may be implemented with a smaller footprint than an equivalent network implemented with real-valued weights. Binary-weight approximations of large CNNs may be implemented with a smaller amount of memory storage, and thus, may be implemented in small portable devices while maintaining the same level of accuracy as real-valued networks. Binary network computations may be performed by enabling binary convolutions within an SRAM array. Binary convolutions may include bit-wise exclusive OR (XOR) operations (or other logic operations) followed by a population-count, as described in more detail herein.

Figure 4:
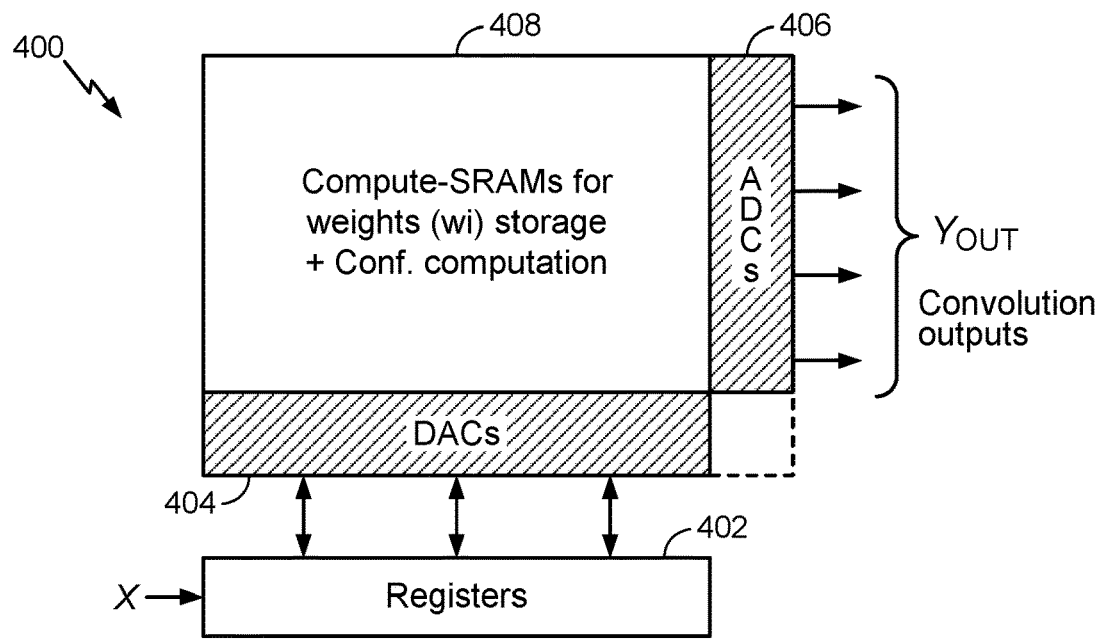
FIG. 4 illustrates a computation system having a static random-access memory (SRAM) implemented for in-memory convolution computation, in accordance with certain aspects of the present disclosure.

FIG. 4 illustrates an example computation system 400 having an SRAM 408 implemented for in-memory convolution computation, in accordance with certain aspects of the present disclosure. The SRAM 408 may include an array of word lines (WLs), each having a complementary word line (WLB). Moreover, the SRAM may include an array of bit lines (BLs), each having a complementary bit line (BLB). Each of the intersections of the BLs and WLs is associated with a memory cell of the SRAM. Thus, the SRAM 408 includes a matrix of i×j memory cells, i representing the number of WLs and j representing the number of BLs.

As illustrated, input data, labeled "X" in FIG. 4, may be input to registers 402. The input data may be provided to word lines of the SRAM 408 via digital-to-analog converters (DACs) 404. The SRAM 408 may perform in-memory convolution computation based on the input data and as a function of weights (wi) stored in the memory cells of the SRAM 408. The output of the computation may be input to analog-to-digital converters (ADCs) 406, which provide output digital convolution outputs, labeled in FIG. 4 as "$Y_{OUT}$."

Figure 5:
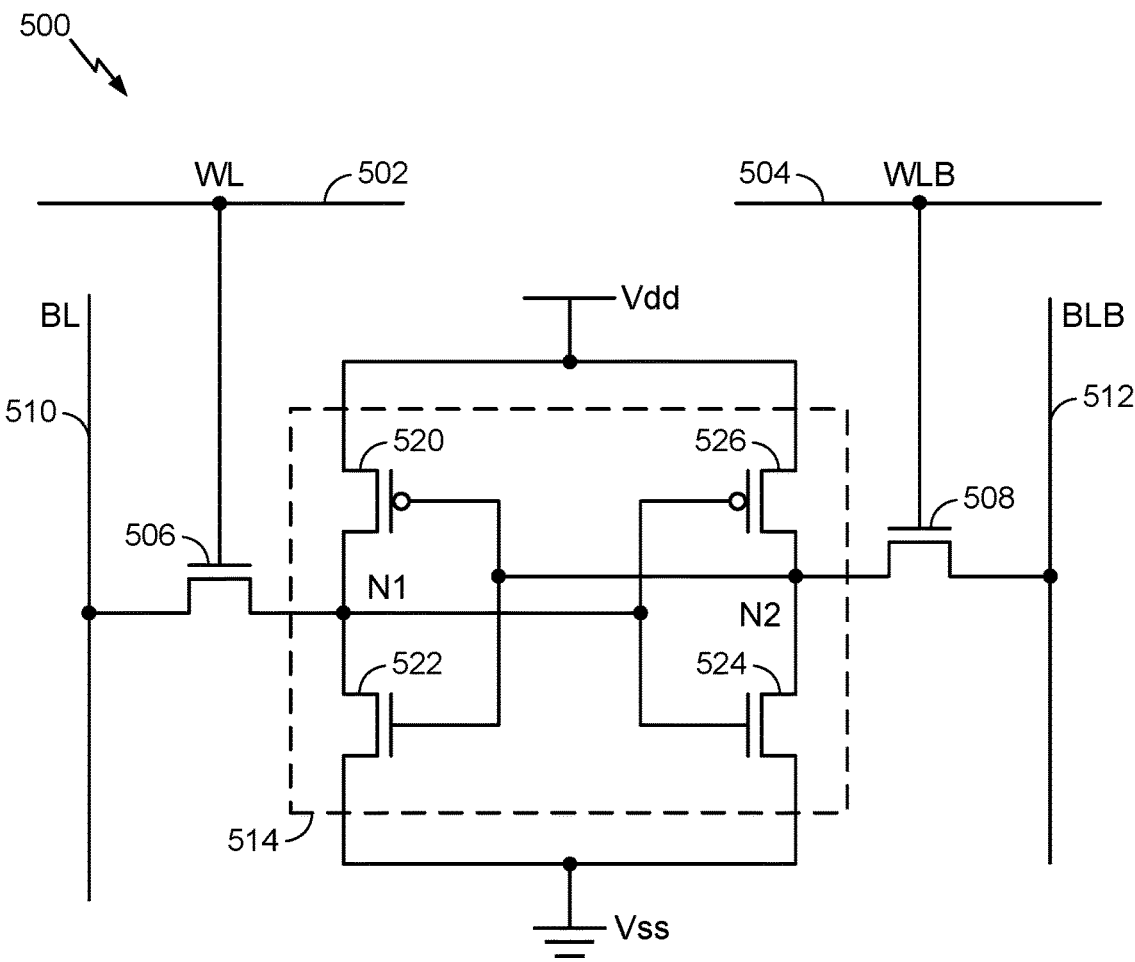
FIG. 5 illustrates a memory cell of the SRAM of FIG. 4, in accordance with certain aspects of the present disclosure.

FIG. 5 illustrates a memory cell 500 of the SRAM 408, in accordance with certain aspects of the present disclosure. As illustrated, the SRAM 408 is implemented using separate word lines (WL 502, WLB 504). The WL 502 is coupled to a control input of a switch 506 for selectively coupling the bit line (BL) 510 to node N1 (also referred to as an output node) of the flip-flop (FF) 514, and the WLB 504 is coupled to a control input of a switch 508 for selectively coupling the bit line (BLB) 512 to node N2 (also referred to as a complementary output node) of the FF 514. The switch 506 and/or the switch 508 may each be implemented using a metal-oxide semiconductor (MOS) transistor.

As illustrated, the FF 514 is coupled between a voltage rail (Vdd) and a reference potential node (e.g., electric ground or Vss). The FF 514 includes a p-type MOS (PMOS) transistor 520 having a drain coupled to a drain of an n-type MOS (NMOS) transistor 522, forming part of node N1. The FF 514 also includes a PMOS transistor 526 having a drain coupled to a drain of an NMOS transistor 524, forming part of node N2. The gates of the PMOS transistor 520 and the NMOS transistor 522 are coupled to the node N2, and the gates of the PMOS transistor 526 and the NMOS transistor 524 are coupled to the node N1, as illustrated. In this manner, the memory cell 500 is implemented with only six transistors: switch 506, switch 508, PMOS transistors 520 and 526, and NMOS transistors 522 and 524. As described in more detail herein, a weight parameter for the neural network may be stored in the FF 514 at nodes N1, N2 of each of the memory cells of the SRAM. The nodes N1, N2 represent the output and complementary output nodes of the FF 514, respectively.

Figures 6A, 6B:
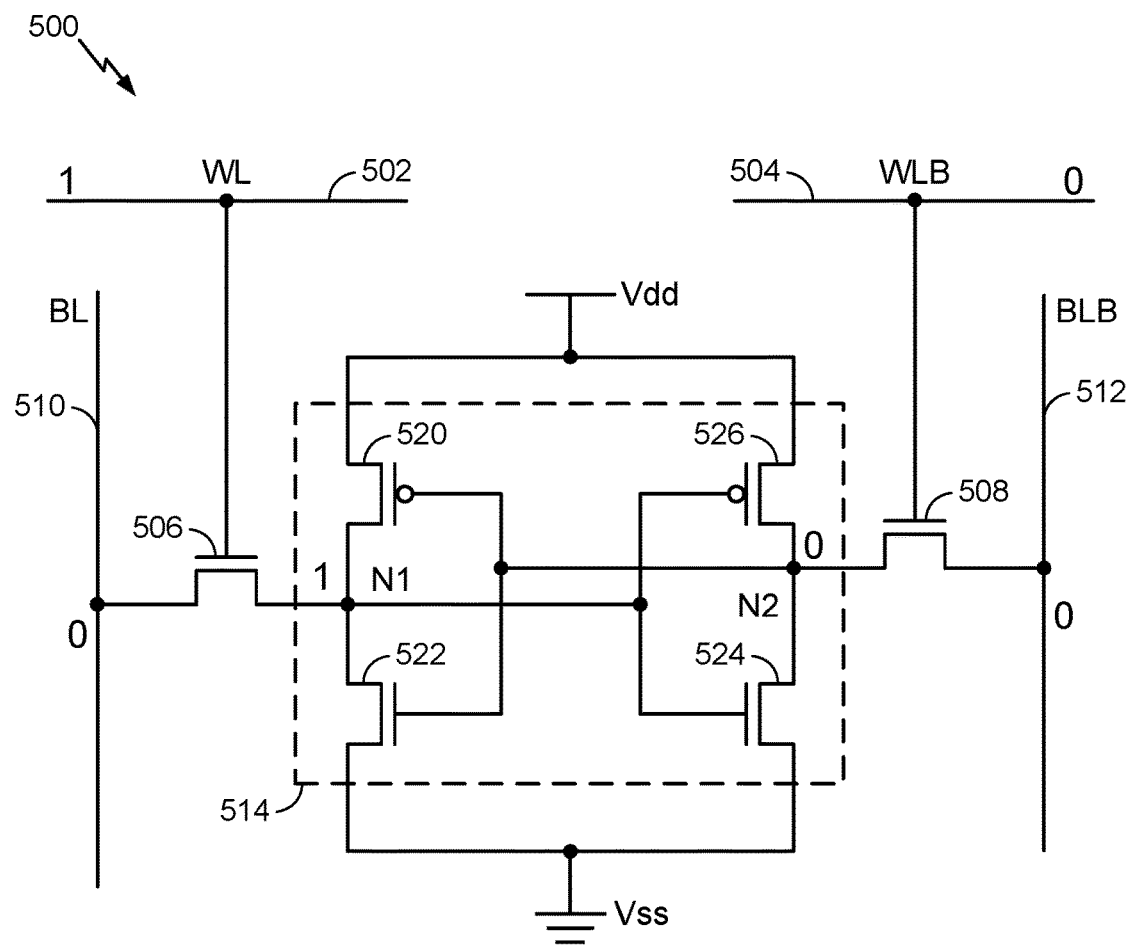
FIGS. 6A and 6B illustrate the memory cell of FIG. 5 in a first configuration and a highlighted corresponding row of a truth table for the memory cell, in accordance with certain aspects of the present disclosure.

FIGS. 6A and 6B illustrate the memory cell 500 in a first logic configuration and an encircled row 602 of the truth table 600 corresponding to the first configuration, in accordance with certain aspects of the present disclosure. While the truth table 600 corresponds to an XOR operation, any of various operations may be performed using the techniques described herein.

In certain aspects, a weight parameter may be previously stored in the FF 514 of the memory cell 500 at nodes N1, N2. The memory cell 500 may receive an input Xi, and provide an output Yj. The memory cell 500 may perform any of various operations (e.g., XOR operation, XNOR operation, NOR operation, or dot product operation) of the input Xi and the weight parameter stored in the FF 514 and provides a corresponding output Yj of the operation.

The output Yj of the memory cell 500 may be detected based on current flow in the BL 510 and/or the BLB 512. For example, a respective one of the ADCs 406 may set voltages of the BL 510 and the BLB 512 to Vdd, and the logic state of the BL 510 and BLB 512 may be detected based on whether there is read current in the BL 510 and/or BLB 512. For example, as illustrated in truth table 600, an input Xi of logic high ("1") may be provided, which corresponds to logic high ("1") at WL 502 and logic low at WLB 504. The output of the memory cell 500 may be detected by a respective one of the ADCs 406 by detecting current flow in the BL 510 and/or BLB 512. For example, depending on the input signal Xi and the weight parameter stored in the FF 514, the FF 514 may or may not draw current from the BL 510 and BLB 512. The weight parameter (Wij) may be previously stored at nodes N1 and N2 by setting both the WL 502 and the WLB 504 to logic high, and setting the desired voltage (e.g., Vdd or electric ground) to BL 510 and BLB 512.

As illustrated in FIGS. 6A and 6B, nodes N1 and N2 of the FF 514 may be programmed to logic high and logic low, respectively, representing a weight parameter (Wij) of logic high. In this case, there will not be any current draw from the BL 510 and BLB 512 by the FF 514 since voltages at both BL 510 and the node N1 are set to Vdd with the switch 506 being closed and the switch 508 being open. Therefore, both the BL 510 and BLB 512 represent logic low for the memory cell 500, providing an output Yj of logic low as illustrated in the truth table 600. In other words, the logic state of the BL 510 and BLB 512 correspond to whether there is current flow between a respective one of nodes N1, N2 and a respective one of BL 510 and BLB 512.

Figures 7A, 7B:
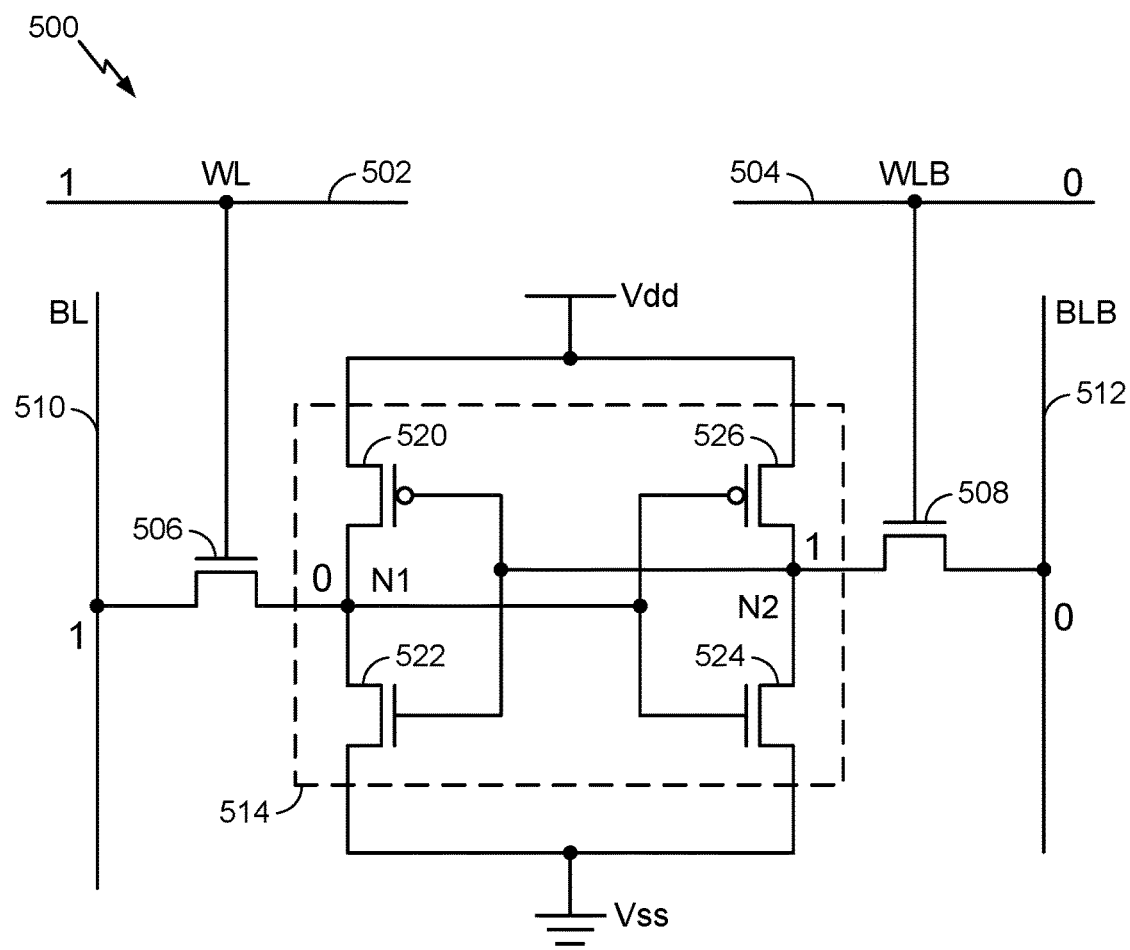
FIGS. 7A and 7B illustrate the memory cell of FIG. 5 in a second configuration and a highlighted corresponding row of the truth table, in accordance with certain aspects of the present disclosure.

FIGS. 7A and 7B illustrate the memory cell 500 in a second logic configuration and an encircled row 702 of the truth table 600 corresponding to the second configuration, in accordance with certain aspects of the present disclosure. As illustrated in row 702, an input Xi of logic high corresponds to logic high at WL 502 and logic low at WLB 504. As illustrated in FIGS. 7A and 7B, nodes N1 and N2 of the FF 514 may be programmed to logic low and logic high respectively, representing the weight parameter (Wij) of logic low. In this case, there will not be any current drawn from the BLB 512 by the FF 514 since the switch 508 is open. However, since switch 506 is closed and the voltage at node N1 is set to logic low (e.g., electric ground), there will be current draw from the BL 510 to node N1 since the voltage at the BL 510 is set to Vdd, and thus, the logic state of BL 510 corresponds to logic high due to the current draw. If either the BL or BLB is logic high, then the output Yj is logic high as well. In this case, the BL 510 is set to logic high and the BLB 512 is set to logic low, providing an output Yj of logic high, as illustrated by the row 702 of the truth table 600.

Figures 8A, 8B:
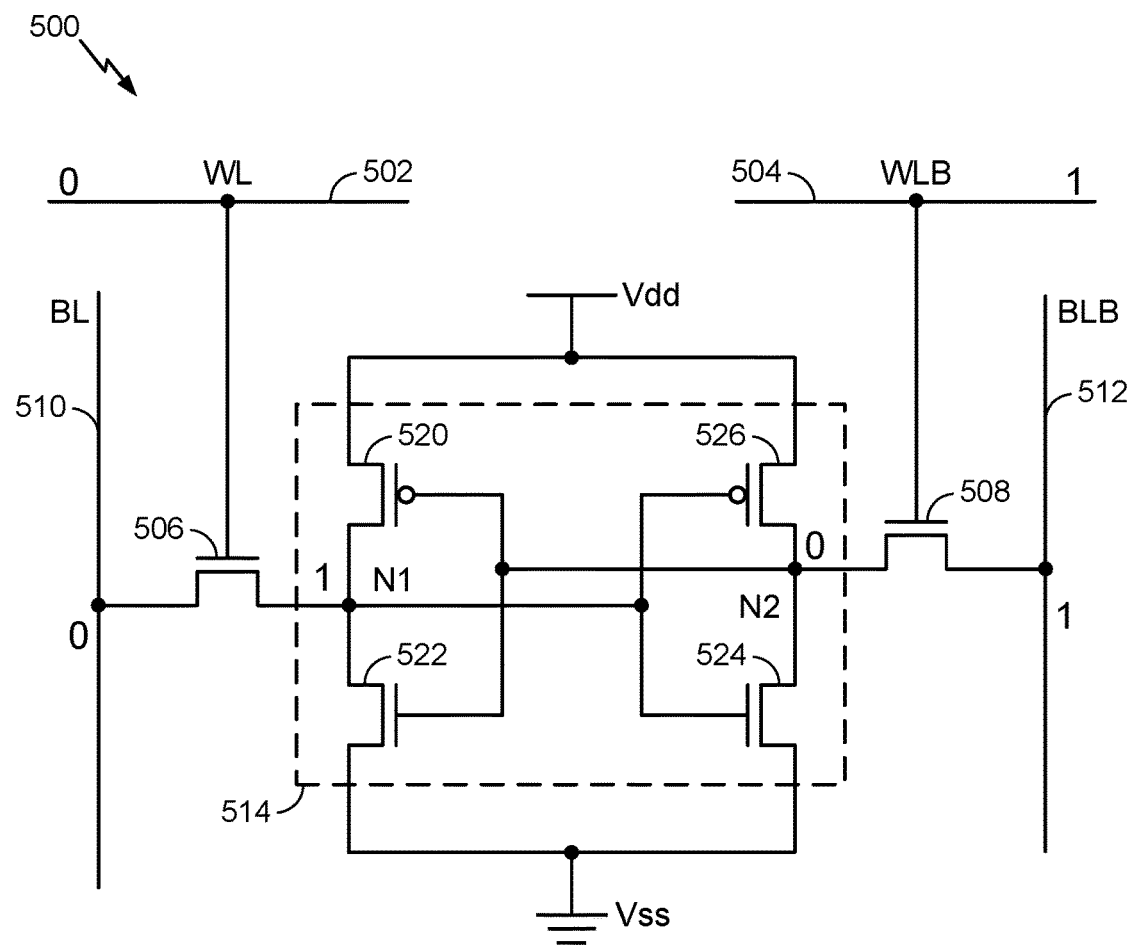
FIGS. 8A and 8B illustrate the memory cell of FIG. 5 in a third configuration and a highlighted corresponding row of the truth table, in accordance with certain aspects of the present disclosure.

FIGS. 8A and 8B illustrate the memory cell 500 in a third logic configuration and an encircled row 802 of the truth table 600 corresponding to the third configuration, in accordance with certain aspects of the present disclosure. As illustrated in row 802, an input Xi of logic low corresponds to logic low at the WL 502 and logic high at the WLB 504. As illustrated in FIGS. 8A and 8B, nodes N1 and N2 of the FF 514 may be programmed to logic high and logic low respectively, representing a weight parameter (Wij) of logic high. In this case, there will not be any current drawn from the BL 510 by the FF 514 since the switch 506 is open. However, since switch 508 is closed and the voltage at node N2 is set to logic low (e.g., electric ground), there will be current draw from BLB 512 to node N2 since the voltage at the BLB 512 is set to Vdd, and thus, the logic state of BLB 512 corresponds to logic high. In this case, BL 510 is set to logic low, and BLB 512 is set to logic high, providing an output Yj of logic high.

Figures 9A, 9B:
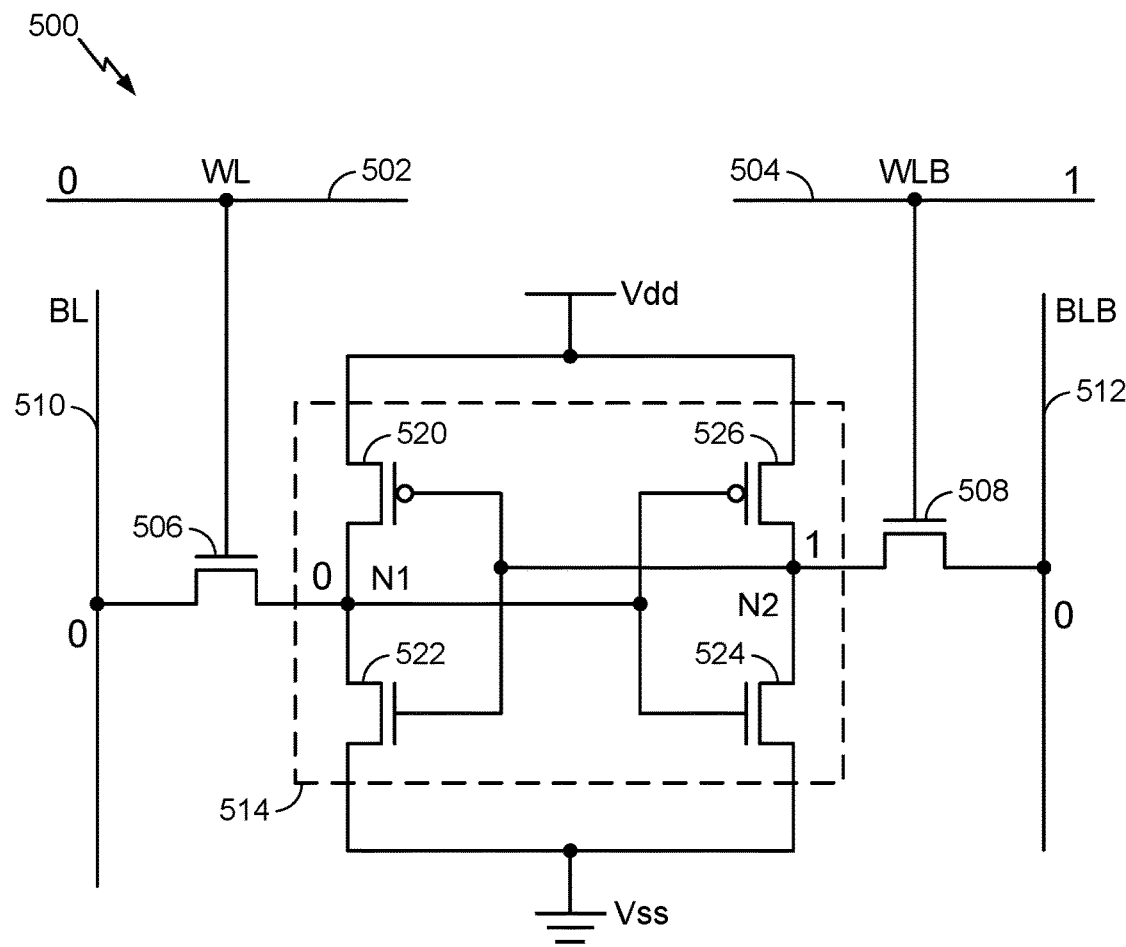
FIGS. 9A and 9B illustrate the memory cell of FIG. 5 in a fourth configuration and a highlighted corresponding row of the truth table, in accordance with certain aspects of the present disclosure.

FIGS. 9A and 9B illustrate the memory cell 500 in a fourth logic configuration and an encircled row 902 of the truth table 600 corresponding to the fourth configuration, in accordance with certain aspects of the present disclosure. As illustrated in row 902, an input Xi of logic low corresponds to logic low at the WL 502 and logic high at the WLB 504. As illustrated in FIGS. 9A and 9B, nodes N1 and N2 of the FF 514 may be programmed to logic low and logic high, respectively. In this case, there will not be any current drawn from the BL 510 and BLB 512 by the FF 514 since voltages at both BLB 512 and the node N2 are set to Vdd with the switch 508 being closed and the switch 506 being open. Therefore, both the BL 510 and BLB 512 correspond to logic low, providing an output Yj of logic low.

The memory cells of the SRAM 408 allow for performing in-memory operations of input signals and weight parameters, and accumulation (population count) of the operations. For example, in an array of SRAM memory cells, the current along the entire column sharing the same BL and BLB may be accumulated and sensed by a respective one of the ADCs 406, based on which the digital output $Y_{OUT}$ is generated. The ADCs 406 may be either binary ADCs, or multi-level ADCs.

The SRAM 408 described herein allows for in-memory computation on the bitline without reading out each row of memory. Each column of the SRAM cells may compute the analog accumulation of operations based on input signals and stored weight parameters. The SRAM 408 provides in-memory operation and accumulation computations with only six transistors per memory cell, providing a reduced memory area as compared to conventional implementations.

While the truth table 600 illustrates the implementation of an XOR operation to facilitate understanding, the techniques described herein may be used to perform any of various suitable operations. For example, FIG. 11A illustrates a truth tables 1100 corresponding to an XNOR operation, in accordance with certain aspects of the present disclosure. The XNOR operation is the logical complement of the XOR operation. As another example, FIG. 11B illustrates a truth table 1102 corresponding to a dot product (AND) operation, in accordance with certain aspects of the present disclosure. As yet another example, FIG. 11C illustrates a truth table 1104 corresponding to a NOR operation, in accordance with certain aspects of the present disclosure.

Figure 10:
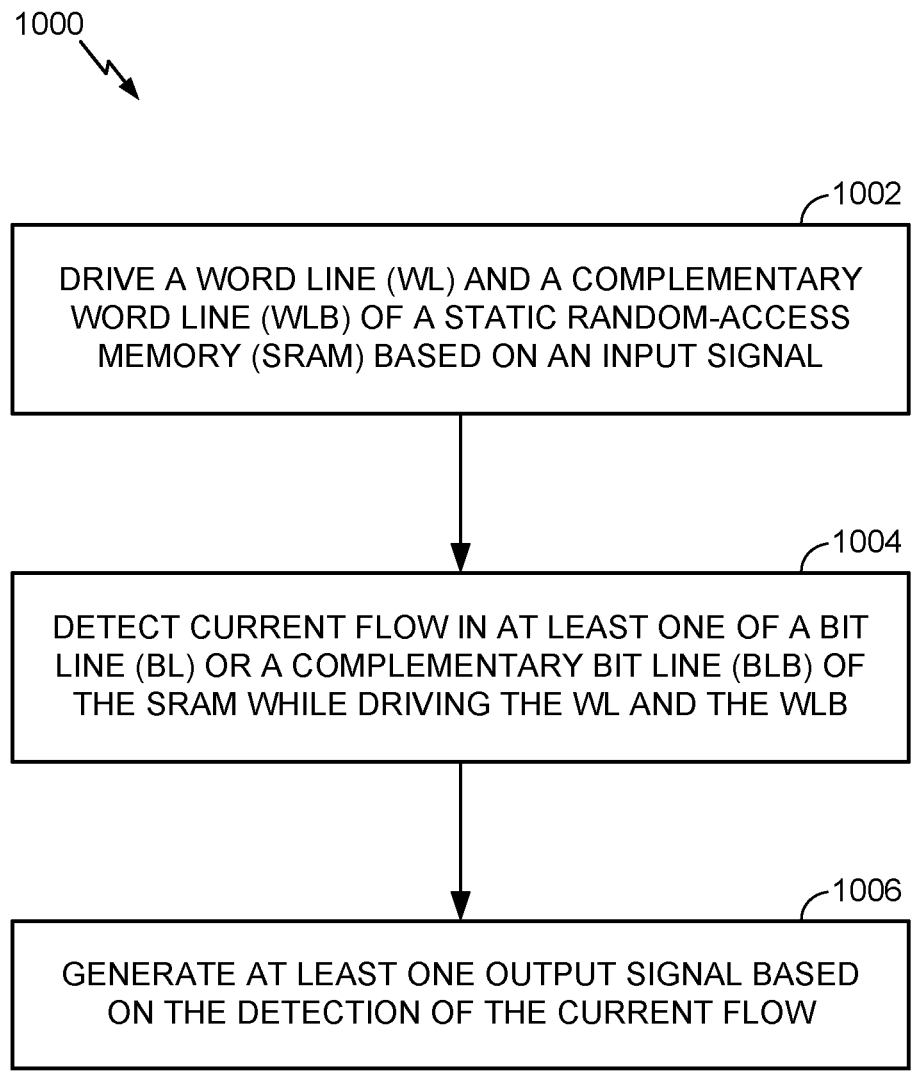
FIG. 10 is a flow diagram illustrating example operations for convolution computation, in accordance with certain aspects of the present disclosure.

FIG. 10 is a flow diagram illustrating example operations 1000 for convolution computation, in accordance with certain aspects of the present disclosure. The operations 1000 may be performed by a computation system, such as the computation system 400 described with respect to FIGS. 4, 5, 6A, 6B, 7A, 7B, 8A, 8B, 9A, and 9B.

The operations 1000 begin, at block 1002, with the computation system driving a word line (e.g., WL 502) and a complementary word line (e.g., WLB 504) of an SRAM (e.g., SRAM 408) based on an input signal. At block 1004, the computation system detects current flow in at least one of a bit line (e.g., BL 510) or a complementary bit line (e.g., BLB 512) of the SRAM while driving the WL and the WLB. At block 1006, the computation system generates at least one output signal based on the detection of the current flow.

In certain aspects, the BL and the BLB are selectively coupled to a flip-flop (e.g., FF 514) of a memory cell (e.g., memory cell 500) of the SRAM, the FF being coupled between a voltage rail (e.g., Vdd) and a reference potential node. In this case, the operations 1000 also include driving the BL and the BLB to a voltage at the voltage rail while detecting the current flow.

In certain aspects, driving the WL includes selectively coupling the BL to a FF (e.g., FF 514) of a memory cell (e.g., memory cell 500) of the SRAM, and driving the WLB comprises selectively coupling the BLB to the FF. In this case, the operations 1000 also include storing a weight parameter of a neural network in the FF, and generating the current flow in the at least one of the BL or the BLB based on the input signal and the weight parameter. In certain aspects, the memory cell is configured to perform an XOR operation (or XNOR operation) based on the weight parameter and the input signal, the current flow representing the XOR operation (or the XNOR operation). In certain aspects, the current flow represents an accumulation of the XOR (or XNOR) operation with one or more other XOR (or XNOR) operations performed by other memory cells selectively coupled to the BL and the BLB.

In certain aspects, programming the weight parameter includes driving the WL to couple the BL to an output node (e.g., node N1) of the FF, driving the WLB to couple the BLB to a complementary output node (e.g., node N2) of the FF, and setting voltages of the BL and the BLB in accordance with the weight parameter.

The various illustrative circuits described in connection with aspects described herein may be implemented in or with an integrated circuit (IC), such as a processor, a digital signal processor (DSP), an application-specific integrated circuit (ASIC), a field-programmable gate array (FPGA), or other programmable logic device. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. In certain aspects, means for driving may include a DAC, such as the DACs 404. Means for storing may include a memory cell, such as the memory cell 500. Means for selectively coupling may include a switch, such as the switch 506. Means for detecting current flow and means for generating may include an ADC, such as the ADCs 406.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An apparatus for convolution computation, comprising:
 a static random-access memory (SRAM) having a plurality of memory cells, each of the plurality of memory cells comprising:
 a flip-flop (FF) having an output node and a complementary output node;
 a first switch coupled between the output node and a bit line (BL) of the SRAM, the first switch having a control input coupled to a word line (WL) of the SRAM; and
 a second switch coupled between the complementary output node and a complementary bit line (BLB) of the SRAM, the second switch having another control input coupled to a complementary word line (WLB) of the SRAM, wherein the memory cell is configured to perform an XOR operation or an XNOR operation based on a weight parameter stored in the FF and an input signal.

2. The apparatus of claim 1, further comprising:
digital-to-analog converter (DAC) circuitry coupled to the WL and the WLB; and
analog-to-digital converter (ADC) circuitry coupled to the BL and the BLB.

3. The apparatus of claim 2, wherein the FF is coupled between a voltage rail and a reference potential node, and wherein the ADC circuitry is configured to:
set a voltage of the BL and the BLB to a voltage at the voltage rail;
detect current flow in at least one of the BL or BLB; and
generate digital signals based on the detection.

4. The apparatus of claim 3, wherein the DAC circuitry is configured to drive the WL and the WLB based on the input signal while the ADC circuitry is detecting the current flow.

5. The apparatus of claim 3, wherein the current flow represents an accumulation of the XOR operation or the XNOR operation with one or more other XOR operations or XNOR operations performed by other memory cells selectively coupled to the BL and the BLB.

6. The apparatus of claim 2, wherein the DAC circuitry is configured to:
close the first switch and the second switch; and
set voltages of the BL and the BLB in accordance with the weight parameter of a neural network to store the weight parameter at the output node of the FF.

7. The apparatus of claim 1, wherein the FF comprises:
a first p-type metal-oxide semiconductor (PMOS) transistor;
a first n-type metal-oxide semiconductor (NMOS) transistor, the first PMOS transistor and the first NMOS transistor having drains coupled to the output node;
a second PMOS transistor; and
a second NMOS transistor, the second PMOS transistor and the second NMOS transistor having drains coupled to the complementary output node.

8. A method for convolution computation, comprising:
driving a word line (WL) and a complementary word line (WLB) of a static random-access memory (SRAM) based on an input signal;
detecting current flow in at least one of a bit line (BL) or a complementary bit line (BLB) of the SRAM while driving the WL and the WLB; and
generating at least one output signal based on the detection of the current flow, wherein the BL and the BLB are selectively coupled to a flip-flop (FF) of a memory cell of the SRAM and wherein the memory cell is configured to perform an XOR operation or an XNOR operation based on a weight parameter and the input signal, the current flow representing the XOR operation or the XNOR operation.

9. The method of claim 8, wherein the FF is coupled between a voltage rail and a reference potential node, the method further comprising driving the BL and the BLB to a voltage at the voltage rail while detecting the current flow.

10. The method of claim 8, wherein:
driving the WL selectively couples the BL to the FF of the memory cell of the SRAM; and
driving the WLB selectively couples the BLB to the FF.

11. The method of claim 10, further comprising:
storing the weight parameter of a neural network in the FF; and
generating the current flow in the at least one of the BL or the BLB based on the input signal and the weight parameter.

12. The method of claim 8, wherein the current flow represents an accumulation of the XOR operation or the XNOR operation with one or more other XOR operations or XNOR operations performed by other memory cells selectively coupled to the BL and the BLB.

13. The method of claim 11, wherein storing the weight parameter comprises:
driving the WL to couple the BL to an output node of the FF;
driving the WLB to couple the BLB to a complementary output node of the FF; and
setting voltages of the BL and the BLB in accordance with the weight parameter to be stored.

14. An apparatus for convolution computation, comprising:
means for driving a word line (WL) and a complementary word line (WLB) of a static random-access memory (SRAM) based on an input signal; and
means for detecting current flow in at least one of a bit line (BL) or a complementary bit line (BLB) of the SRAM while driving the WL and the WLB, the means for detecting comprising means for generating at least one output signal based on the detection of the current flow, wherein the BL and the BLB are selectively coupled to a flip-flop (FF) of a memory cell of the SRAM and wherein the memory cell is configured to perform an XOR operation or an XNOR operation based on a weight parameter and the input signal, the current flow representing the XOR operation or the XNOR operation.

15. The apparatus of claim 14, wherein:
the FF is coupled between a voltage rail and a reference potential node; and
the apparatus further comprises means for driving the BL and the BLB to a voltage at the voltage rail while detecting the current flow.

16. The apparatus of claim 14, further comprising:
means for selectively coupling the BL to the FF of the memory cell of the SRAM based on the means for driving the WL; and
means for selectively coupling the BLB to the FF based on the means for driving the WLB.

17. The apparatus of claim 16, wherein:
the apparatus further comprises means for storing the weight parameter of a neural network in the FF; and
the current flow is generated in the at least one of the BL or the BLB based on the input signal and the weight parameter.

* * * * *